United States Patent
Tanaka et al.

(10) Patent No.: US 7,482,958 B2
(45) Date of Patent: Jan. 27, 2009

(54) OFDM RECEIVER

(75) Inventors: Masato Tanaka, Tokyo (JP); Hiroji Akahori, Tokyo (JP)

(73) Assignee: Oki Semiconductor Co., Ltd. (JP)

( * ) Notice: Subject to any disclaimer, the term of this patent is extended or adjusted under 35 U.S.C. 154(b) by 0 days.

(21) Appl. No.: 11/874,293

(22) Filed: Oct. 18, 2007

(65) Prior Publication Data

US 2008/0100485 A1    May 1, 2008

(30) Foreign Application Priority Data

Oct. 27, 2006    (JP) .............................. 2006-292398

(51) Int. Cl.
*H03M 1/00* (2006.01)
(52) U.S. Cl. ...................... 341/139; 370/210; 375/345; 375/295
(58) Field of Classification Search .......... 341/130–150
See application file for complete search history.

(56) References Cited

U.S. PATENT DOCUMENTS 6,658,063 B1 * 12/2003 Mizoguchi et al. .......... 375/260
7,058,002 B1 * 6/2006 Kumagai et al. ............ 370/203
7,251,288 B2 * 7/2007 Imamura .................... 375/295
7,283,598 B2 * 10/2007 Akita et al. ................. 375/316

FOREIGN PATENT DOCUMENTS

JP    2004-153811    5/2004

* cited by examiner

*Primary Examiner*—Lam T Mai
(74) *Attorney, Agent, or Firm*—Studebaker & Brackett PC; Donald R. Studebaker

(57) ABSTRACT

The present invention provides an OFDM receiver having a level control section comprising comparators which respectively compare a first signal outputted from an ADC with threshold values, counters which respectively count the frequencies with which the level of the first signal exceeds the threshold values, based on second and third signals corresponding to the results of comparison by the comparators, a moving average unit which calculates an average value of the level of the first signal lying in a predetermined period, based on fourth and fifth signals corresponding to the frequencies counted by the these counters, and a DAC which generates a gain control signal for controlling an AMP in such a manner that the average level of the first signal outputted from the ADC becomes a predetermined value, according to a sixth signal calculated by the moving average unit.

1 Claim, 2 Drawing Sheets

OFDM RECEIVER

BACKGROUND OF THE INVENTION

The present invention relates to an OFDM (orthogonal Frequency Division Multiplex) receiver such as a digital terrestrial broadcasting receiver or the like, and particularly to level control on a received signal converted into an intermediate frequency by a tuner.

FIG. 2 is a block diagram showing the outline of a conventional digital terrestrial broadcasting receiver.

The digital terrestrial broadcasting receiver has an antenna 1 which receives an OFDM-modulated wireless or radio signal RF lying in an UHF (Ultra High Frequency) band, and a tuner 3 which frequency-converts the radio signal RF received by the antenna 1 in accordance with a local oscillation signal LO of a local oscillator 2 to thereby generate an intermediate frequency signal IF for a desired reception channel. The intermediate frequency signal IF is amplified in such a manner that average power becomes a constant value by a variable gain amplifier (hereinafter called "AMP") 4 whose amplification is controlled by a gain control signal AGC, after which it is supplied to an analog-digital converter (hereinafter called "ADC") 5. A fast Fourier transformer (hereinafter called "FFT") 6 and a power calculator 7 are connected to the output side of the ADC 5.

The FFT 6 converts a time-domain signal converted to a digital value by the ADC 5 to a frequency-domain signal corresponding to a plurality of carriers constituting OFDM. Although not shown in the drawing, an equalizing unit which generates receive data in sync between the plurality of carriers, an error correction unit, a video/audio reproducing unit, etc. are connected to the output side of the FFT 6.

On the other hand, the power calculator 7 calculates a value corresponding to the average power of the output signal of the AMP 4, based on the time-domain signal converted to the digital value by the ADC 5. The output signal of the power calculator 7 is supplied to a digital-analog converter (hereinafter called "DAC") 8, where it is converted into an analog signal, followed by being supplied to the AMP 4 as a gain control signal AGC.

In the digital terrestrial broadcasting receiver, a wireless or radio signal RF lying in a range of 450 MHz to 700 MHz, which has been received by the antenna 1, is converted into an intermediate frequency signal IF whose band is about 450 kHz with its center frequency as about 500 kHz by the tuner 3. For example, 108 carriers are multiplexed into the intermediate frequency signal IF. Each modulated wave has been quadrature-modulated based on data constituting broadcast contents and a control signal. The intermediate frequency signal IF outputted from the tuner 3 is amplified to a predetermined level by the AMP 4, followed by being supplied to the ADC 5, where it is converted into a digital value in accordance with a sampling clock of 2 MHz, for example. The received signal converted into digital form by the ADC 5 is supplied to the FFT 6, where it is separated into signals set every carrier, thereby generating receive data, after which they are reproduced as images and sound.

Further, the received signal converted into the digital value by the ADC 5 is supplied to the power calculator 7, where average power set for a predetermined period (e.g., 1 symbol period corresponding to modulation unit of carrier=about 1 ms) is calculated. The value of the average power calculated by the power calculator 7 is converted into an analog gain control signal ACC by the DAC 8, followed by being supplied to the AMP 4. In the AMP 4, its amplification is reduced when the gain control signal AGC becomes larger, whereas when the gain control signal AGC becomes smaller, its amplification increases. Thus, the average power of the output signal of the AMP 4 converges to a predetermined value.

Accordingly, the received signal suitably converted into the digital value is obtained from the ADC 5 by setting the average power outputted from the AMP 4 so as to reach the optimum input level of the ADC 5.

The above related art refers to a patent document 1 (Japanese Unexamined Patent Publication No. 2004-153811).

However, the following problems arise upon calculation of the average power by the power calculator 7.

That is, there is a need to calculate instantaneous power and calculate its average value upon calculation of average power. Since the instantaneous power is proportional to the square of the voltage, it is necessary to perform a square calculation of the digital value outputted from the ADC 5 in accordance with a sampling clock. Since the range of the digital value outputted from the ADC 5 is of a relatively wide-ranging value, the number of digits for the squared result becomes large. Further, there is a need to accumulatively add the values of respective instantaneous power for one symbol period (about 1 ms) for the purpose of determining the average power. Therefore, the problems arose in that there was a need to perform a high-capacity calculation at high speed, and the scale of the power calculator 7 would increase.

SUMMARY OF THE INVENTION

The present invention has been made in view of the foregoing. It is therefore an object of the present invention to provide an OFDM receiver having a level control function, which is capable of holding an intermediate frequency signal supplied to an ADC at a predetermined level.

According to one aspect of the present invention, for attaining the above object, there is provided an OFDM receiver which receives an OFDM-modulated wireless signal and converts the same into an intermediate frequency signal and which amplifies the intermediate frequency signal by an AMP and thereafter processes the same so as to be converted into a digital signal by an ADC, comprising a level control section including:

comparators which respectively compare a signal level outputted from the ADC with threshold values;

counters which respectively count the frequencies with which the signal level exceeds the threshold values, based on the results of comparison by the comparators;

a moving average unit which calculates an average value of the signal level lying within a predetermined period on the basis of the frequencies counted by the counters; and a DAC which generates a gain control signal for controlling the AMP in such a manner that an average level of the digital signal outputted from the ADC reaches a predetermined value, according to the average value calculated by the moving average unit.

In the present invention, there is provided a level control section which generates a gain control signal for controlling an AMP by comparators, counters, a moving average unit and a DAC Thus, an advantageous effect is brought about in that an intermediate frequency signal supplied to an ADC can be held at a predetermined level with a simple circuit configuration as compared with the conventional level control section constituted of the power calculator in which the multiplier and adder large in the number of digits are combined together.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

DETAILED DESCRIPTION OF THE PREFERRED EMBODIMENTS

The above and other objects and novel features of the present invention will become more completely apparent from the following descriptions of preferred embodiment when the same is read with reference to the accompanying drawings. The drawings, however, are for the purpose of illustration only and by no means limitative of the scope of the invention.

Preferred Embodiment

Figure 1:
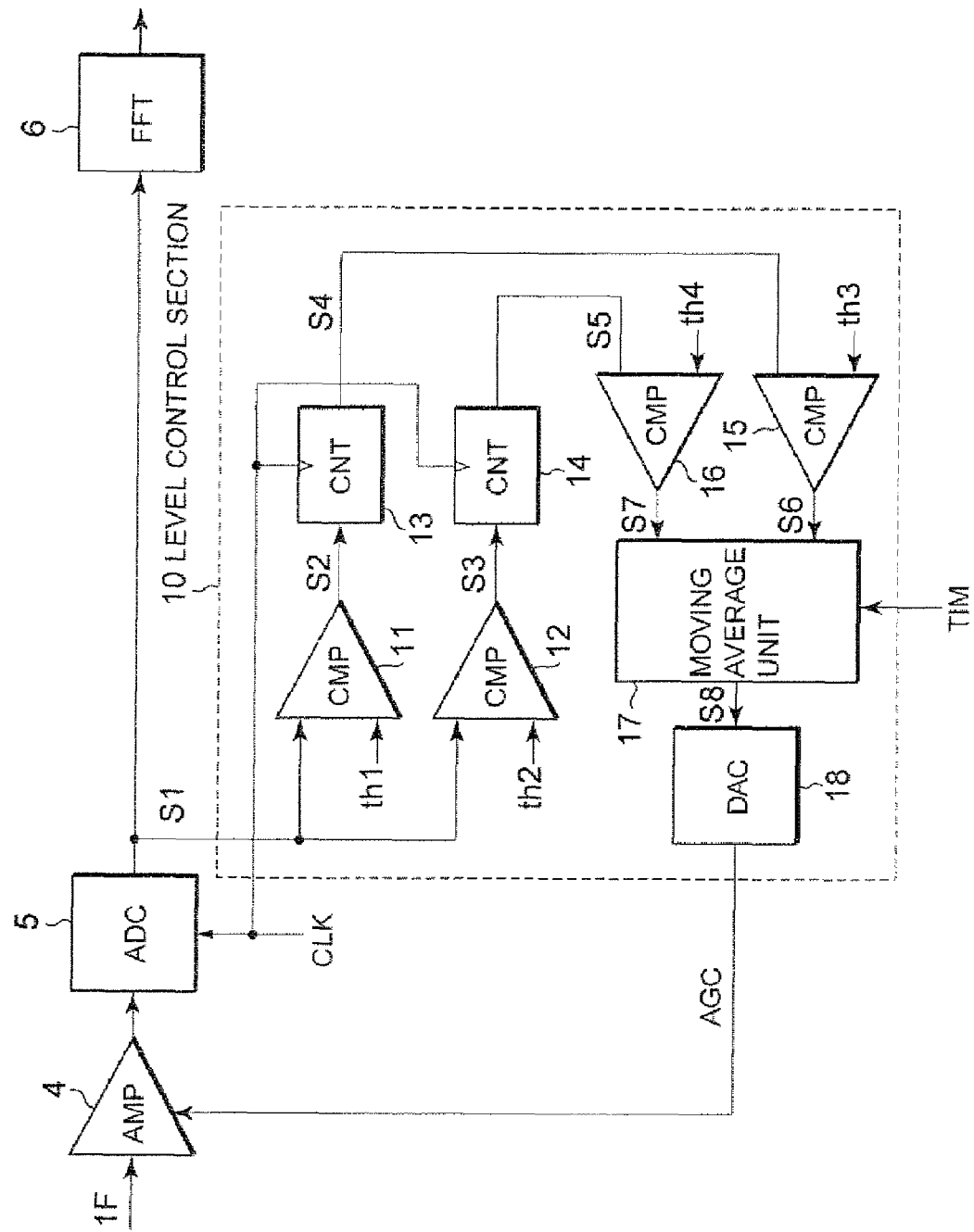
FIG. 1 is a configuration diagram of a level control section of a digital terrestrial broadcasting receiver showing an embodiment of the present invention.

FIG. 1 is a configuration diagram of a level control section of a digital terrestrial broadcasting receiver showing an embodiment of the present invention.

Figure 2:
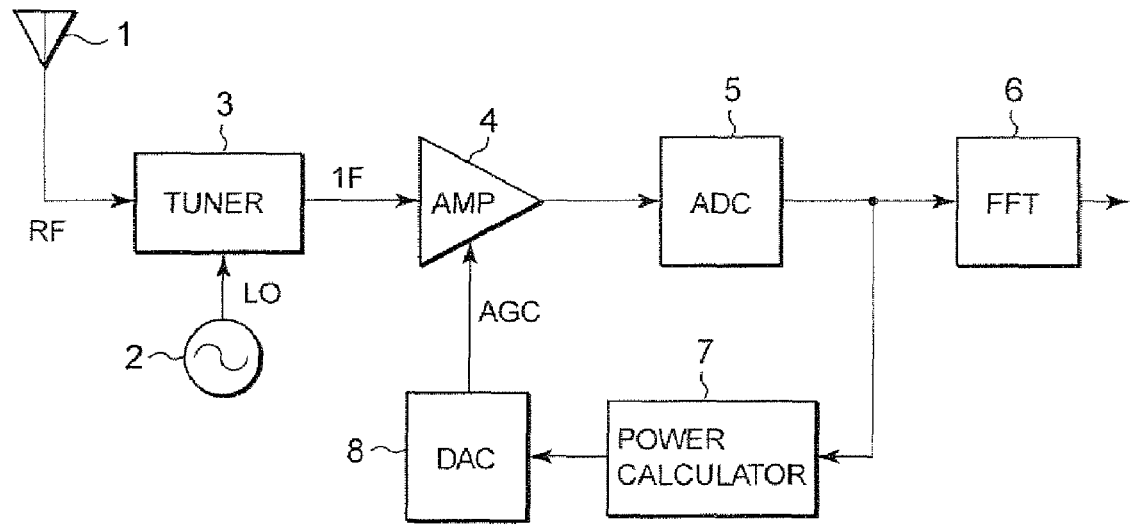
FIG. 2 is a block diagram showing the outline of a conventional digital terrestrial broadcasting receiver.

The level control section 10 is provided in place of the power calculator 7 and the DAC 8 employed in the digital terrestrial broadcasting receiver shown in FIG. 2. Other configurations are similar to those shown in FIG. 2.

The level control section 10 has comparators (CMP) 11 and 12 which respectively compare a signal S1 converted to a digital value by an ADC 5 with threshold values th1 and th2 (where th1>th2). The comparator 11 outputs a signal S2 brought to "1" when S1>th1 and brought to "0" when S1≦th1. Further, the comparator 12 outputs a signal S3 brought to "1" when S1>th2 and brought to "0" when S1≦th2. Counters (CNT) 13 and 14 are respectively connected to the output sides of the comparators 11 and 12.

The counter 13 counts a sampling clock CLK of the ADC 5 when the signal S2 supplied thereto from the comparator 11 is "1". The counter 14 counts the sampling clock CLK of the ADC 5 when the signal S3 supplied thereto from the comparator 12 is "1". These counters 13 and 14 respectively output signals S4 and S5 corresponding to count results every 1 symbol period. The output side of the counter 13 is connected to a comparator 15 which compares the signal S4 with a threshold value th3, whereas the output side of the counter 14 is connected to a comparator 16 which compares the signal S5 with a threshold value th4.

The comparator 15 outputs a signal S6 brought to "−1" when S4>th3 and brought to "+1" when S1≦th1. The comparator 16 outputs a signal S7 brought to "−1" when S5>th4 and brought to "+1" when S5<th4. The output sides of the comparators 15 and 16 are connected to a moving average unit 17.

The moving average unit 17 accumulatively adds the average values of the signals S6 and S7 in accordance with a symbol timing signal TIM for a predetermined period and outputs the so-added value as a signal S8. The signal S8 is supplied to a DAC 18.

The DAC 18 converts the signal S8 outputted from the moving average unit 17 into an analog signal and supplies the same to an AMP 4 as a gain control signal AGC.

Figure 3:
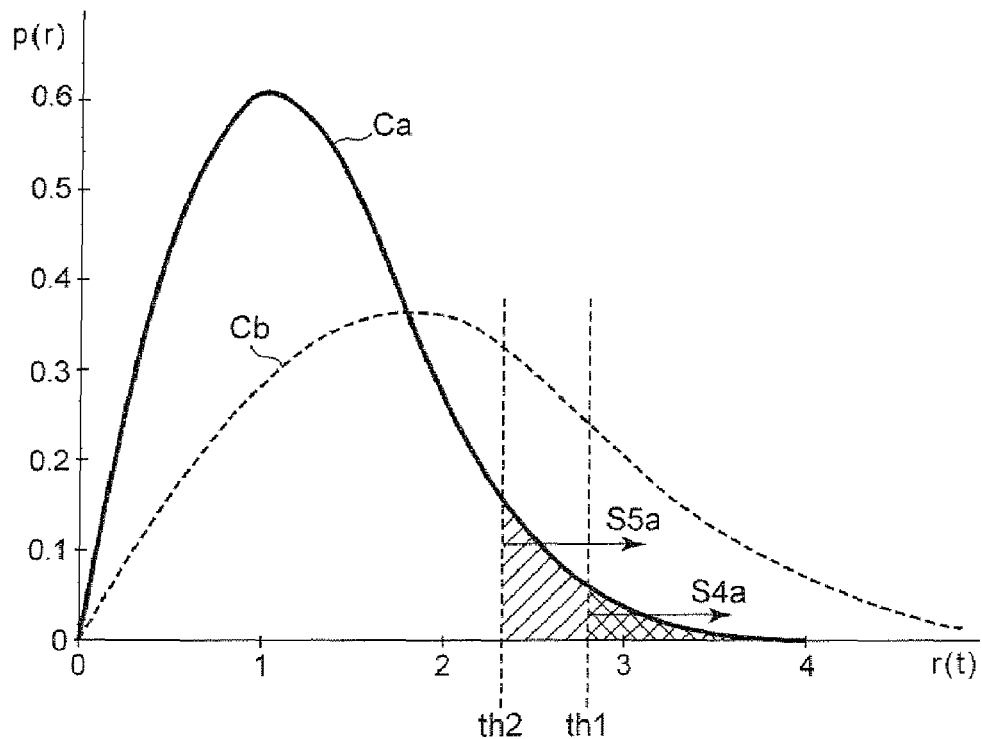
FIG. 3 is an explanatory diagram illustrating the principle of operation of the level control section 10 shown in FIG. 1.

FIG. 3 is an explanatory diagram showing the principle of operation of the level control section 10 shown in FIG. 1.

Since an intermediate frequency signal IF inputted to the AMP 4 is of an OFDM-modulated signal, it is constituted of one obtained by adding a plurality of orthogonal sinusoidal waves together, whose amplitude can be approximated by a normal distribution.

Therefore, assuming that the instantaneous value of the intermediate frequency signal IF is expressed in complex number as z(t)=x(t)+jy(t), normal distributions p(x) and p(y) about the amplitudes of orthogonal components x(t) and y(t) are respectively expressed in the following independent equations:

$$p(x) = \frac{1}{\sqrt{2\pi}\sigma} e^{\frac{x^2}{2\sigma^2}}, \, p(y) = \frac{1}{\sqrt{2\pi}\sigma} e^{\frac{y^2}{2\sigma^2}} \quad (1)$$

Assuming now that r(t) is taken as the amplitude of the present signal, r(t) is expressed in the following equation:

$$r(t) = \sqrt{x^2(t) + y^2(t)} \quad (2)$$

A probability density distribution p(r) of the amplitude is expressed in the following equation:

$$p(r) = \frac{r}{\sigma^2} e^{\frac{r^2}{2\sigma^2}} \quad (3)$$

A curve Ca in FIG. 3 shows the relationship between the amplitude r and the probability density distribution p(r) at the time that the horizontal axis is taken as the amplitude r and the vertical axis is taken as the probability density distribution p(r). The area of a portion surrounded by the curve Ca and the horizontal axis corresponds to the number of samples by the ADC 5. That is, the amplitude r on the horizontal axis of FIG. 3 corresponds to the value of the signal S1 corresponding to the output of the ADC 5 in FIG. 1.

The comparators 11 and 12 respectively compare the amplitude r of the signal S1 subjected to sampling and converted in digital form, with the threshold values th1 and th2. The counters 13 and 14 respectively count the number of times in which the amplitude r has exceeded the threshold values th1 and th2 respectively.

Thus, when the probability density distribution of the signal S1 is represented in the form of the curve Ca shown in FIG. 3, for example, the value of a signal S4a outputted from the counter 13 in accordance with the result of sampling during one symbol period corresponds to the area of a portion surrounded by the curve Ca and the horizontal axis in FIG. 3 and located on the right side of the vertical line at r=th1. The value of a signal S5a outputted from the counter 14 corresponds to the area of a portion surrounded by the curve Ca and the horizontal axis in FIG. 3 and located on the right side of the vertical line at r=th2.

The values of the signals S4a and S5a are respectively compared with the threshold values th3 and th4 by the comparators 15 and 16. The comparators 15 and 16 respectively output signals S6a and S7a brought to −1 when they are larger than the threshold values and brought to +1 when they are smaller than the threshold values. The signals S4a and S5a are accumulatively added by the moving average unit 17 for a predetermined period in accordance with the symbol timing signal TIM, and the so-added value is outputted therefrom as a signal S8a.

Next, when the average level of the signal S1 becomes larger, the probability density distribution of the signal S1 spreads in the horizontal direction as represented by a curve Cb of FIG. 3, and its peak value in the vertical axis direction becomes smaller. In this case, the value of a signal S4b outputted from the counter 13 corresponds to the area of a portion surrounded by the curve Cb and the horizontal axis in FIG. 3 and located on the right side of the vertical line at r=th1. The value of a signal S5b outputted from the counter 14 corresponds to the area of a portion surrounded by the curve Cb and the horizontal axis of FIG. 3 and located on the right side of the vertical line at r=th2. Accordingly, S4a<S4b and S5a<S5b.

When the signals S4b and S5b increase and exceed the threshold values th3 and th4 respectively, the signals S6a and S7a outputted from the comparators 15 and 16 become −1, and the value of a signal S5b outputted from the moving average unit 17 becomes smaller than the signal S8a used up to now.

The signal S8a is converted into an analog signal by the DAC 18, which in turn is supplied to the AMP 4 as a gain control signal AGC. Therefore, the amplification of the AMP 4 is reduced so that its output level is lowered. Thus, the average level of the signal S1 outputted from the ADC 5 is reduced. With such feedback action, the average level of the signal S1 outputted from the ADC 5 is held at predetermined level.

As described above, the level control section 10 of the present embodiment has the advantage that since it is constituted of the comparators 11 and 12 or the like and the counters 13 and 14 or the like, the intermediate frequency signal IF supplied to the ADC 5 can be held at a predetermined level with a simple circuit configuration as compared with the case in which the power calculator in which the conventional multiplier and adder large in the number of digits are combined together is used. Incidentally, the level control section of the present embodiment can be applied not only to the digital terrestrial broadcasting receiver but also to other OFDM receivers.

While the preferred form of the present invention has been described, it is to be understood that modifications will be apparent to those skilled in the art without departing from the spirit of the invention. The scope of the invention is to be determined solely by the following claims.

What is claimed is:

1. An OFDM receiver which receives an orthogonal frequency division multiplex-modulated wireless signal and converts the same into an intermediate frequency signal and which amplifies the intermediate frequency signal by a variable gain amplifier and thereafter processes the same so as to be converted into a digital signal by an analog-digital converter, comprising a level control section including:

comparators which respectively compare a signal level outputted from the analog-digital converter with threshold values;

counters which respectively count frequencies with which the signal level exceeds the threshold values, based on the results of comparison by the comparators;

a moving average unit which calculates an average value of the signal level lying within a predetermined period on the basis of the frequencies counted by the counters; and a digital-analog converter which generates a gain control signal for controlling the variable gain amplifier in such a manner that an average level of the digital signal outputted from the analog-digital converter reaches a predetermined value, according to the average value calculated by the moving average unit.

* * * * *